United States Patent
Martin et al.

(10) Patent No.: US 11,335,222 B2
(45) Date of Patent: May 17, 2022

(54) METHOD FOR DETECTING DEFECTS IN ULTRA-HIGH RESOLUTION PANELS

(71) Applicant: PHOTON DYNAMICS, INC., San Jose, CA (US)

(72) Inventors: Raul Albert Martin, San Jose, CA (US); Richard Norio Blythe, Tokyo (JP)

(*) Notice: Subject to any disclaimer, the term of this patent is extended or adjusted under 35 U.S.C. 154(b) by 0 days.

(21) Appl. No.: 16/609,653

(22) PCT Filed: Jun. 18, 2018

(86) PCT No.: PCT/US2018/037979
§ 371 (c)(1),
(2) Date: Oct. 30, 2019

(87) PCT Pub. No.: WO2018/236699
PCT Pub. Date: Dec. 27, 2018

(65) Prior Publication Data
US 2020/0111396 A1    Apr. 9, 2020

Related U.S. Application Data

(60) Provisional application No. 62/590,277, filed on Nov. 23, 2017, provisional application No. 62/523,275, filed on Jun. 22, 2017.

(51) Int. Cl.
G09G 3/00       (2006.01)
G01R 31/58      (2020.01)
G01R 31/308     (2006.01)

(52) U.S. Cl.
CPC ........... *G09G 3/006* (2013.01); *G01R 31/308* (2013.01); *G01R 31/58* (2020.01)

(58) Field of Classification Search
CPC ...... G09G 3/006; G01R 31/58; G01R 31/308; G01R 31/304
See application file for complete search history.

(56) References Cited

U.S. PATENT DOCUMENTS 4,940,934 A    7/1990   Kawaguchi et al.
5,175,504 A    12/1992  Henley
(Continued)

FOREIGN PATENT DOCUMENTS

CN    1514231 A    7/2004
CN    1700026 A    11/2005
(Continued)

OTHER PUBLICATIONS

International Search Report for PCT/US2018/037979 dated Sep. 10, 2018 (PCT/ISA/210).
(Continued)

*Primary Examiner* — Akm Zakaria
(74) *Attorney, Agent, or Firm* — Hodgson Russ LLP

(57) ABSTRACT

A system for inspection of electrical circuits, which electrical circuits include a multiplicity of conductors which are mutually spaced from each other, the system including a voltage driver operative to apply different electrical voltages to a plurality of conductors from among the multiplicity of conductors, which plurality of conductors are in spatial propinquity to each other, a sensor operative to sense at least one characteristic of a test region defined thereby with respect to the electrical circuits, the sensor lacking sufficient spatial resolution to distinguish between the locations of individual ones of the plurality of conductors and a defect indicator responsive to at least one output of the sensor for ascertaining whether a defect exists in the plurality of conductors.

34 Claims, 4 Drawing Sheets

(56) References Cited

U.S. PATENT DOCUMENTS

| | | |
|---|---|---|
| 5,432,461 A | 7/1995 | Henley |
| 5,764,209 A | 6/1998 | Hawthorne et al. |
| 6,154,561 A | 11/2000 | Pratt et al. |
| 6,219,443 B1 | 4/2001 | Lawrence |
| 6,323,653 B1 | 11/2001 | Field et al. |
| 6,545,500 B1* | 4/2003 | Field .................. G09G 3/006 |
| | | 324/750.12 |
| 6,630,832 B1* | 10/2003 | Harzanu ........... G01R 31/2805 |
| | | 324/537 |
| 6,768,112 B2 | 7/2004 | Yamazaki et al. |
| 6,878,956 B2 | 4/2005 | Yamada |
| 7,084,970 B2 | 8/2006 | Weiss et al. |
| 7,176,433 B1 | 2/2007 | Rosengaus |
| 7,324,214 B2 | 1/2008 | De Groot et al. |
| 7,468,611 B2 | 12/2008 | Nguyen et al. |
| 7,772,869 B2 | 8/2010 | Lee et al. |
| 7,924,435 B2 | 4/2011 | Colonna De Lega et al. |
| 7,948,636 B2 | 5/2011 | De Groot et al. |
| 8,212,752 B2 | 7/2012 | Lee et al. |
| 8,761,518 B2 | 6/2014 | Inoue et al. |
| 9,142,605 B2 | 9/2015 | Nakamura |
| 9,437,126 B2 | 9/2016 | Shin |
| 2006/0125510 A1 | 6/2006 | Brunner et al. |
| 2008/0315908 A1* | 12/2008 | Gardner ................ G09G 3/006 |
| | | 324/760.01 |
| 2012/0075320 A1* | 3/2012 | Handschy ........... G09G 3/3629 |
| | | 345/559 |
| 2014/0062521 A1 | 3/2014 | Yamada |
| 2015/0309086 A1 | 10/2015 | Hiroki |
| 2016/0370425 A1 | 12/2016 | Stallcup et al. |
| 2017/0004614 A1 | 1/2017 | Suwa et al. |

FOREIGN PATENT DOCUMENTS

| | | |
|---|---|---|
| CN | 1705889 A | 12/2005 |
| CN | 104050907 A | 9/2014 |
| JP | 2007206081 A | 8/2007 |
| TW | 200512467 A | 4/2005 |
| TW | 201317571 A | 5/2013 |
| TW | 201416756 A | 5/2014 |
| WO | 2005/015266 A1 | 2/2005 |
| WO | 2012176563 A1 | 12/2012 |
| WO | 2016/199009 A1 | 12/2016 |

OTHER PUBLICATIONS

Written Opinion of the International Searching Authority for PCT/US2018/037979 dated Sep. 10, 2018 (PCT/ISA/237).
CNIPA, First Office Action for CN Application No. 201880029780.9, dated Dec. 22, 2021 (see X/Y/A designations at p. 17).
TIPO, First Office Action for TW Application No. 107119622, dated Dec. 29, 2021 (see X/Y/A designations at p. 9).

* cited by examiner

METHOD FOR DETECTING DEFECTS IN ULTRA-HIGH RESOLUTION PANELS

REFERENCE TO RELATED APPLICATIONS

This application is a National Stage of International Application No. PCT/US2018/037979 filed Jun. 18, 2018. Reference is made to U.S. Provisional Patent Application Ser. No. 62/523,275, filed Jun. 22, 2017, entitled Method of Detecting Defects in Ultra High Resolution Panels, and U.S. Provisional Patent Application Ser. No. 62/590,277 filed Nov. 23, 2017, entitled A Method for Detecting Defects in Ultra-High Resolution Panels the disclosure of both is hereby incorporated by reference and priority of which is claimed pursuant to 37 C.F.R. 1.78(a)(1).

FIELD OF THE INVENTION

The present invention relates to automated electrical circuit inspection systems and methods.

BACKGROUND OF THE INVENTION

Various types of flat panel display inspection systems are known. One early such system is described in U.S. Pat. No. 5,764,209, the disclosure of which is hereby incorporated by reference.

SUMMARY OF THE INVENTION

The present invention seeks to provide an improved system and method for electrical circuit inspection.

There is thus provided in accordance with a preferred embodiment of the present invention a system for inspection of electrical circuits, which electrical circuits include a multiplicity of conductors which are mutually spaced from each other, the system including a voltage driver operative to apply different electrical voltages to a plurality of conductors from among the multiplicity of conductors, which plurality of conductors are in spatial propinquity to each other, a sensor operative to sense at least one characteristic of a test region defined thereby with respect to the electrical circuits, the sensor lacking sufficient spatial resolution to distinguish between the locations of individual ones of the plurality of conductors and a defect indicator responsive to at least one output of the sensor for ascertaining whether a defect exists in the plurality of conductors.

Preferably, the voltage driver applies the different electrical voltages which are selected such that the overall superimposition of the electrical fields at the test region is zero in the absence of defects in the plurality of conductors. Additionally, the voltage driver applies the different electrical voltages which are selected such that the overall superimposition of the electrical fields at the test region is non-zero in the presence of defects in the plurality of conductors.

In accordance with a preferred embodiment of the present invention the defect indicator is operative to ascertain the location of a defect based on the overall superimposition of the electrical fields at the test region detected by the sensor. Additionally, the defect indicator ascertains the location of a defect based on a value of the overall superimposition of the electrical fields at the test region.

Preferably, the test region overlies the plurality of conductors.

In accordance with a preferred embodiment of the present invention the sensor is an electric field sensor. Preferably, the sensor is an electro-optical sensor. Alternatively, the sensor is an optical sensor.

In accordance with a preferred embodiment of the present invention the defect indicator provides a human visually sensible indication of a defect and its location.

There is also provided in accordance with another preferred embodiment of the present invention a system for inspection of electrical circuits, which electrical circuits include a multiplicity of conductors which are mutually spaced from each other, the system including a sensor operative to sense at least one characteristic of a test region defined thereby with respect to the electrical circuits, a voltage driver operative to apply different electrical voltages to a plurality of conductors from among the multiplicity of conductors, which plurality of conductors are in spatial propinquity to each other, the voltage driver selecting the different electrical voltages such that the overall superimposition of the electrical fields at the test region is zero in the absence of defects in the plurality of conductors and a defect indicator responsive to an output of the sensor for ascertaining whether a defect exists in the plurality of conductors.

In accordance with a preferred embodiment of the present invention the sensor lacks sufficient spatial resolution to distinguish between the locations of the plurality of conductors. Additionally or alternatively, the voltage driver applies the different electrical voltages which are selected such that the overall superimposition of the electrical fields at the test region is non-zero in the presence of defects in the plurality of conductors.

Preferably, the defect indicator is operative to ascertain a defect location based on the overall superimposition of the electrical fields at the test region detected by the sensor. Additionally, the defect indicator ascertains the defect location based on a value of the overall superimposition of the electrical fields at the test region.

In accordance with a preferred embodiment of the present invention the test region overlies the plurality of conductors.

Preferably, the sensor is an electric field sensor.

In accordance with a preferred embodiment of the present invention the sensor is an electro-optical sensor. Alternatively, the sensor is an optical sensor.

In accordance with a preferred embodiment of the present invention the defect indicator provides a human visually sensible indication of a defect and its location.

Preferably, the sensor includes an electro-optic modulator. Additionally, the defect indicator includes a camera which images the electro-optic modulator and provides a camera output, image enhancement circuitry which receives the camera output and provides an image enhanced output and a display for displaying the image enhanced output.

In accordance with a preferred embodiment of the present invention the multiplicity of conductors includes a multiplicity of mutually spaced generally parallel conductors and the voltage driver simultaneously applies different voltages to alternating ones of the generally parallel conductors. Additionally, the superimposed electric field in the test region at locations between each of the adjacent generally parallel conductors is approximately zero in the absence of a defect in the adjacent generally parallel conductors. Additionally or alternatively, the sensor senses the overall superimposed electric field in the test region between each of the adjacent generally parallel conductors rather than at the location of a given conductor.

In accordance with a preferred embodiment of the present invention the sensor is separated from the electric circuit by a perpendicular distance which is a multiple of the distance separating adjacent ones of the mutually spaced parallel conductors. Preferably, the multiple is greater than two.

There is further provided in accordance with yet another preferred embodiment of the present invention a method for inspection of electrical circuits, which electrical circuits include a multiplicity of conductors which are mutually spaced from each other, the method including applying different electrical voltages to a plurality of conductors from among the multiplicity of conductors, which plurality of conductors are in spatial propinquity to each other, sensing at least one characteristic of a test region defined thereby with respect to the electrical circuits, the sensing utilizing a sensor lacking sufficient spatial resolution to distinguish between the locations of individual ones of the plurality of conductors and ascertaining, responsive to the sensing, whether a defect exists in the plurality of conductors.

Preferably, the method for inspection of electrical circuits also includes selecting the different electrical voltages such that an overall superimposition of the electrical fields at the test region is zero in the absence of defects in the plurality of conductors and non-zero in the presence of defects in the plurality of conductors.

In accordance with a preferred embodiment of the present invention the sensing includes sensing utilizing at least one of an electric field sensor, an electro-optic sensor and an optical sensor.

In accordance with a preferred embodiment of the present invention the method for inspection of electrical circuits also includes, if a defect is detected in the plurality of conductors, ascertaining a location of the defect. Additionally, the method for inspection of electrical circuits also includes if a defect is detected, providing a human visually sensible indication of a defect and its location, and if no defect is detected, providing a human visually sensible indication that no defect has been detected.

There is still further provided in accordance with still another preferred embodiment of the present invention a method for inspection of electrical circuits, which electrical circuits include a multiplicity of conductors which are mutually spaced from each other, the method including applying different electrical voltages to a plurality of conductors from among the multiplicity of conductors, which plurality of conductors are in spatial propinquity to each other, selecting the different electrical voltages such that an overall superimposition of the electrical fields at the test region is zero in the absence of defects in the plurality of conductors and non-zero in the presence of defects in the plurality of conductors, sensing at least one characteristic of a test region defined thereby with respect to the electrical circuits and ascertaining, responsive to the sensing, whether a defect exists in the plurality of conductors.

In accordance with a preferred embodiment of the present invention the sensing includes sensing utilizing at least one of an electric field sensor, an electro-optic sensor and an optical sensor.

Preferably, the method for inspection of electrical circuits also includes, if a defect is detected in the plurality of conductors, ascertaining a location of the defect. Additionally, the method for inspection of electrical circuits also includes, if a defect is detected, providing a human visually sensible indication of a defect and its location and, if no defect is detected, providing a human visually sensible indication that no defect has been detected.

BRIEF DESCRIPTION OF THE DRAWINGS

The present invention will be understood and appreciated more fully from the following detailed description, taken in conjunction with the drawings in which.

DETAILED DESCRIPTION OF A PREFERRED EMBODIMENT

Figure 1A:
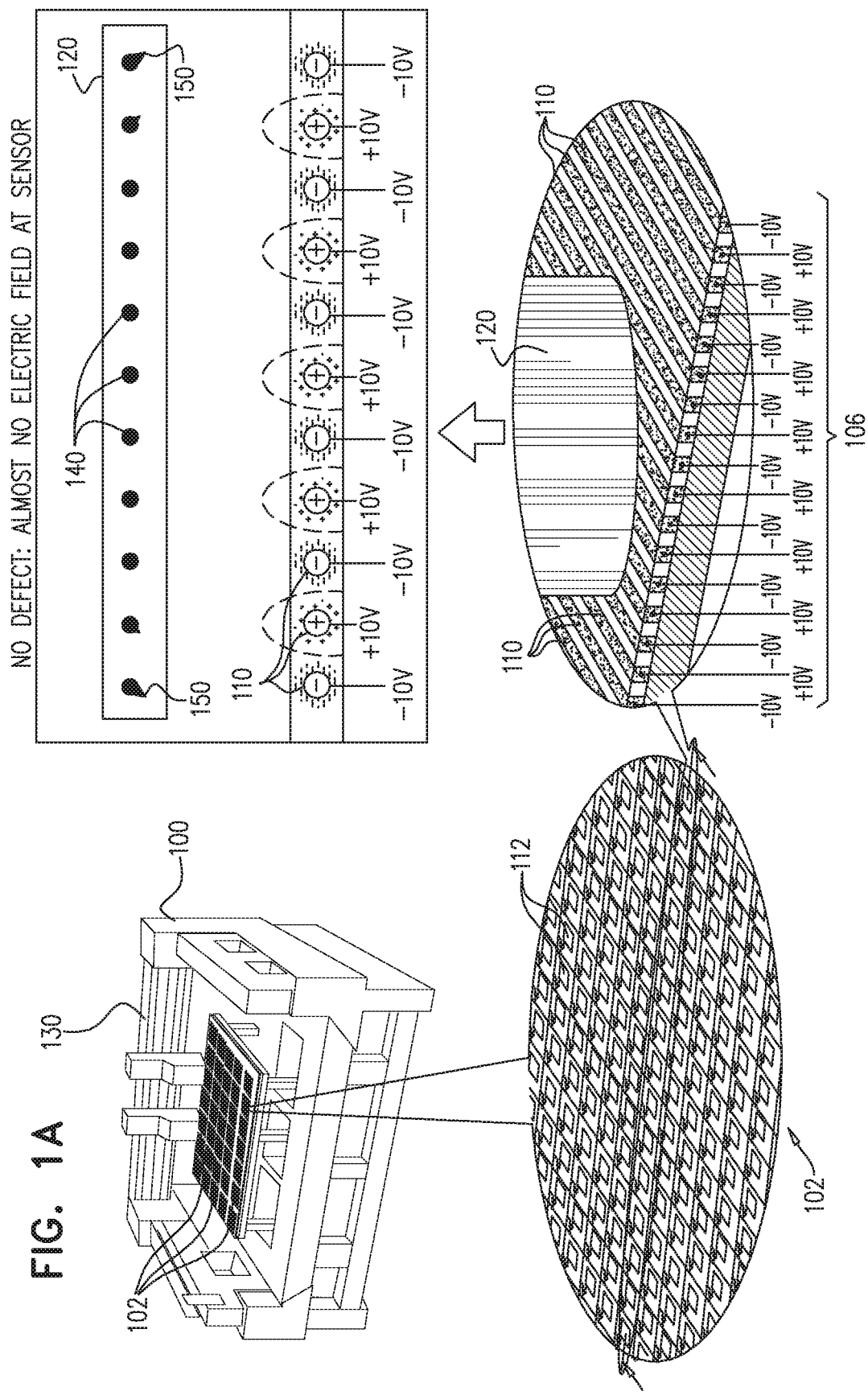
FIG. 1A is a simplified conceptual illustration of a system for inspection of electrical circuits, constructed and operative in accordance with a preferred embodiment of the present invention, in a no defect detected operative orientation.
Figure 1B:
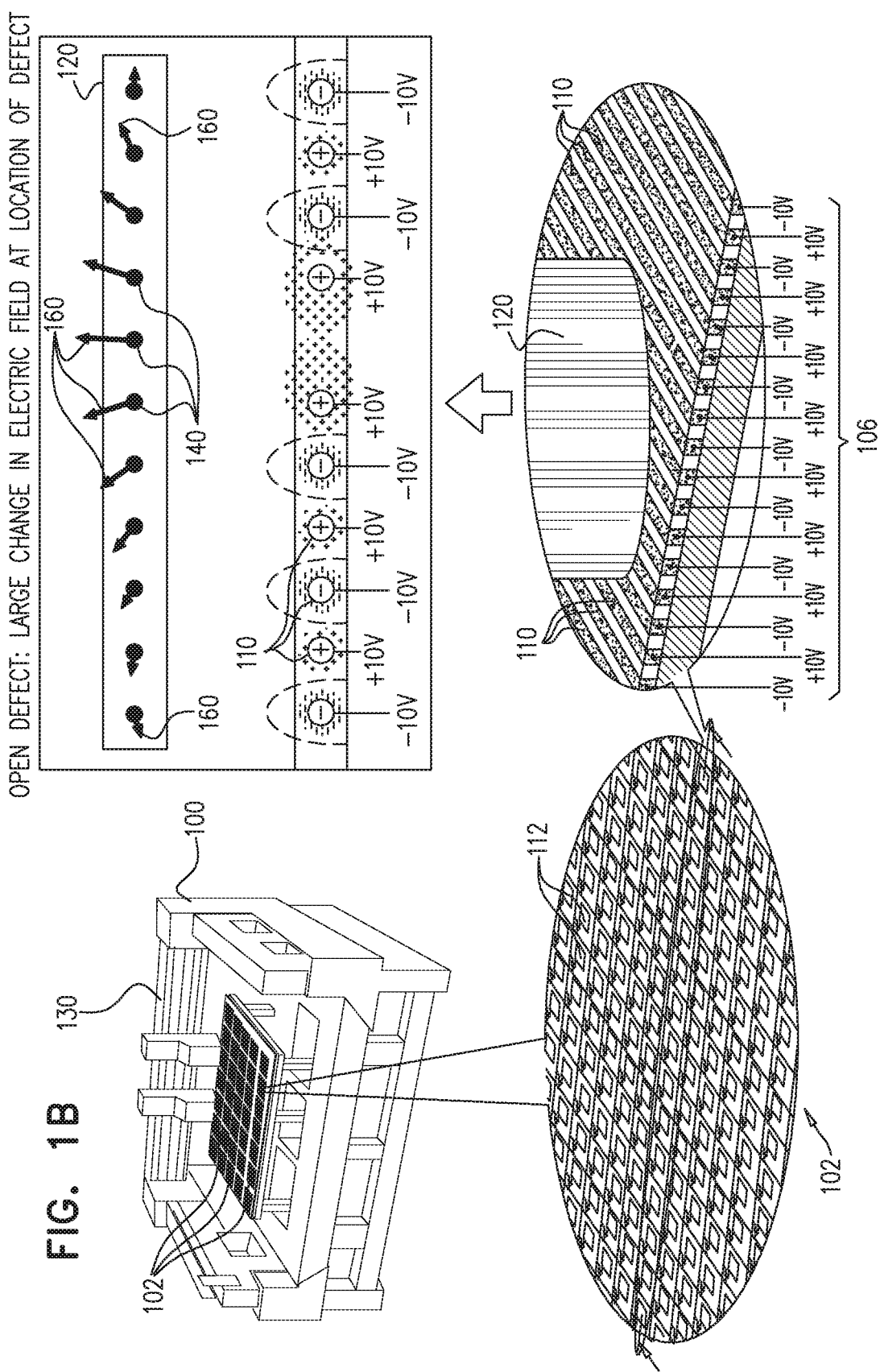
FIG. 1B is a simplified conceptual illustration of a system for inspection of electrical circuits, constructed and operative in accordance with a preferred embodiment of the present invention, in a first type defect detected operative orientation.
Figure 1C:
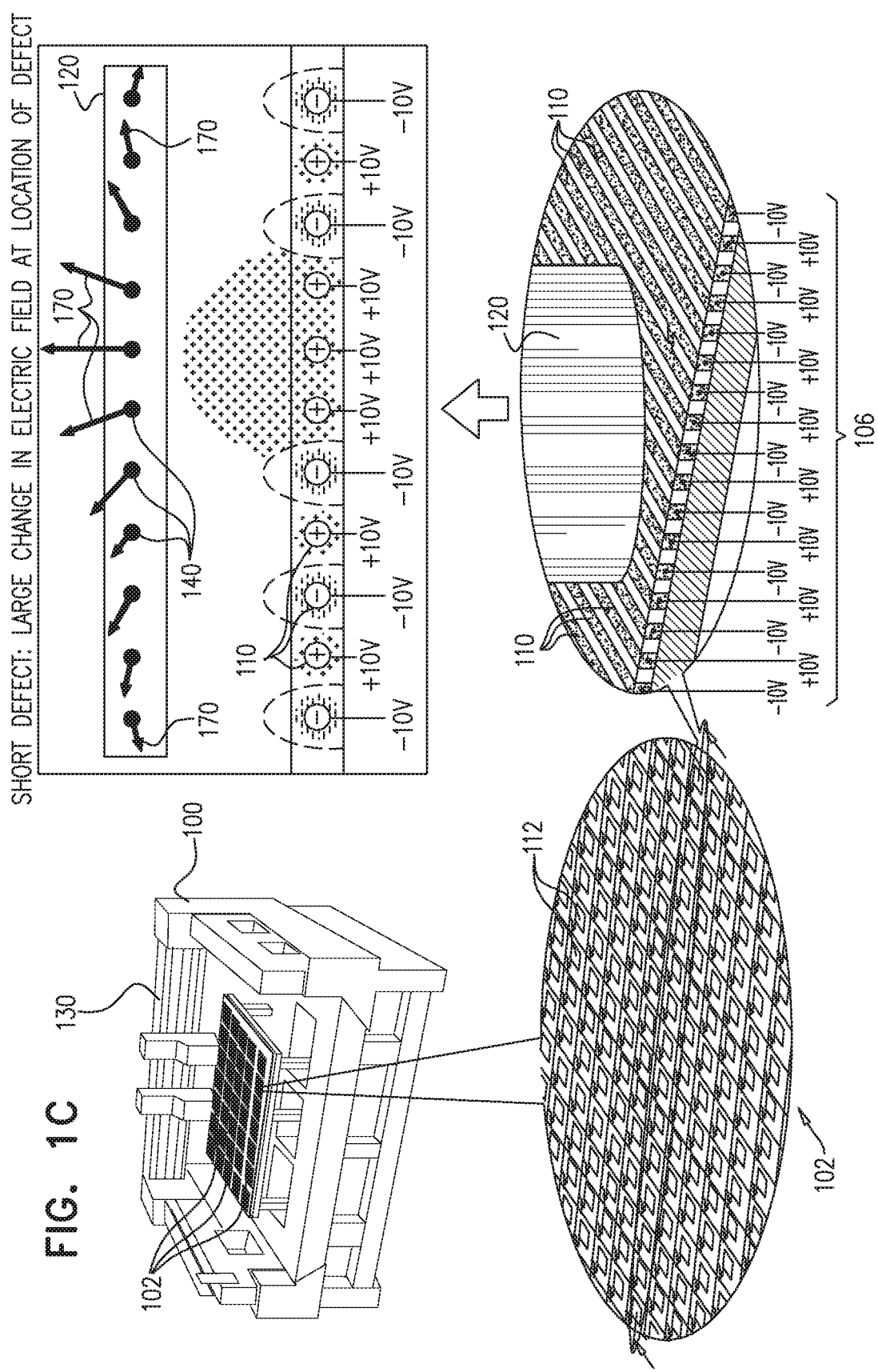
FIG. 1C is a simplified conceptual illustration of a system for inspection of electrical circuits, constructed and operative in accordance with a preferred embodiment of the present invention, in a second type defect detected operative orientation.

Reference is now made to FIGS. 1A-1C, each of which is a simplified conceptual illustration of a system for inspection of electrical circuits, constructed and operative in accordance with a preferred embodiment of the present invention, in a different defect detection operative orientation.

As seen in FIGS. 1A-1C, the system may comprise a conventional automated electrical circuit inspection chassis, preferably an automated flat panel display inspection chassis 100, such as a model AC6068 ARRAY CHECKER, commercially available from Orbotech Ltd. of Yavne, Israel. Preferably, the system is employed for inspection of flat panel displays, however it may be employed for inspection of any other suitable type of electrical circuits.

As seen in FIGS. 1A-1C, typically a sheet of glass, which may also be referred to as a substrate or a plate, including a plurality of backplane electronic circuitries 102 for one or more flat panel displays, is supported on chassis 100. Typically, backplane electronic circuitries 102 on a substrate are identical, but a single substrate may also contain backplane electronic circuitries 102 of different shapes and designs. The substrates, which typically range in size from 2 m by 2 m to 3 m by 3 m, are subdivided, typically following inspection, into a large number of backplane electronic circuitries 102, of which there are typically a few when the displays are intended for use in televisions and up to thousands when the displays are intended for use in telephones or other small display size applications. Typically, each of the backplane electronic circuitries 102 to be inspected includes at least one array 106 of generally uniformly spaced, generally parallel electrical conductors 110. The at least one array 106 may be one or two dimensional. Typically, each electrical conductor 110 in the at least one array 106 is associated with at least one individual pixel 112 of the flat panel display backplane electronic circuitry 102.

As seen in the bottom left enlargement in each of FIGS. 1A-1C, flat panel display backplane electronic circuitries 102 include a two-dimensional array of individual pixels 112. Each pixel 112 may be considered as an individual conductor, which is electrically controlled by a circuit. Each such circuit comprises a plurality of conducting, insulating and semiconducting elements. Each pixel may be driven with electrical signals, such that an array of pixels corresponds to a one-dimensional or two-dimensional array of parallel conductors.

Currently, the state of the art high resolution flat panel displays have a conductor width of 5-20 microns and a conductor to conductor spacing of 10-30 microns. In the future, the conductor widths and the spaces between conductors are expected to be even smaller.

In accordance with a preferred embodiment of the present invention, during inspection of each of the identical flat panel display backplane electronic circuitries 102, adjacent ones of the uniformly spaced conductors 110 are maintained at voltages of respective opposite polarity. While uniformly spaced conductors 110 are typically spaced in a generally parallel configuration, it is appreciated that uniformly spaced conductors 110 may be in any suitable geometric configuration.

In accordance with a preferred embodiment of the present invention, an electric field sensor 120, preferably an electro-optic sensor comprising an electro-optic modulator, but alternatively any other suitable sensor, such as an optical sensor, is mounted on a gantry 130 which is movable in scanning relationship to chassis 100 over a flat panel display backplane electronic circuitry 102 so as to temporarily overlie a multiplicity of uniformly spaced conductors 110 and to sense the superimposition of the electric fields produced by adjacent conductors 110.

It is a particular feature of an embodiment of the present invention that, in contradistinction to the prior art, normally in the absence of defects in the conductors 110 being inspected, the sensor 120 senses a zero or very near zero electrical field, which represents the superimposition of the electrical fields produced by the adjacent conductors 110 which are maintained at identical voltages of opposite polarity. In the presence of a defect, the sensor 120 senses a non-zero electrical field.

It is a further particular feature of an embodiment of the present invention that inasmuch as the sensor 120 is sensing the superimposition of the electrical fields produced by the conductors, it may be located at a perpendicular separation from the conductors 110 defined by a perpendicular distance which is greater than the distance required to sense the electric fields generated by individual conductors 110. Typically, sensor 120 is separated from conductors 110 of backplane electronic circuitries 102 by a perpendicular distance which is a multiple of the distance separating adjacent ones of conductors 110. Preferably, the multiple is greater than two.

Accordingly, the perpendicular distance may be 30-50 microns for a conductor width of 5-20 microns and a conductor separation of 10-30 microns. Accordingly, the sensor 120 need not have sufficient spatial resolution to distinguish between the locations of individual ones of the plurality of conductors.

Turning now specifically to FIG. 1A, it is seen that in the absence of a defect, such as a short or a break in one of conductors 110, the electrical field sensed at various locations in sensor 120, illustrated by black dots 140, is zero, other than typically at edges of the sensor 120, as indicated by arrows 150, or as produced by shot noise, which is random and generally self-cancelling.

Turning now to FIG. 1B, it is seen that in the presence of a defect such as break in one of the conductors 110, two adjacent conductors are at the same voltage of the same polarity and thus the superimposition of the electric fields produced thereby as sensed at sensor 120 is non-zero, as seen by arrows 160.

Turning now to FIG. 1C, it is seen that in the presence of a defect such as short between two adjacent conductors 110, three adjacent conductors are at the same voltage of the same polarity and thus the superimposition of the electric fields produced thereby as sensed at sensor 120 is non-zero, as seen by arrows 170. It is appreciated that the electric field configuration produced by a short, as seen in FIG. 1C, is typically different from that produced by a break, as seen in FIG. 1B, and thus these two types of defects may be distinguished from each other.

Figure 2:
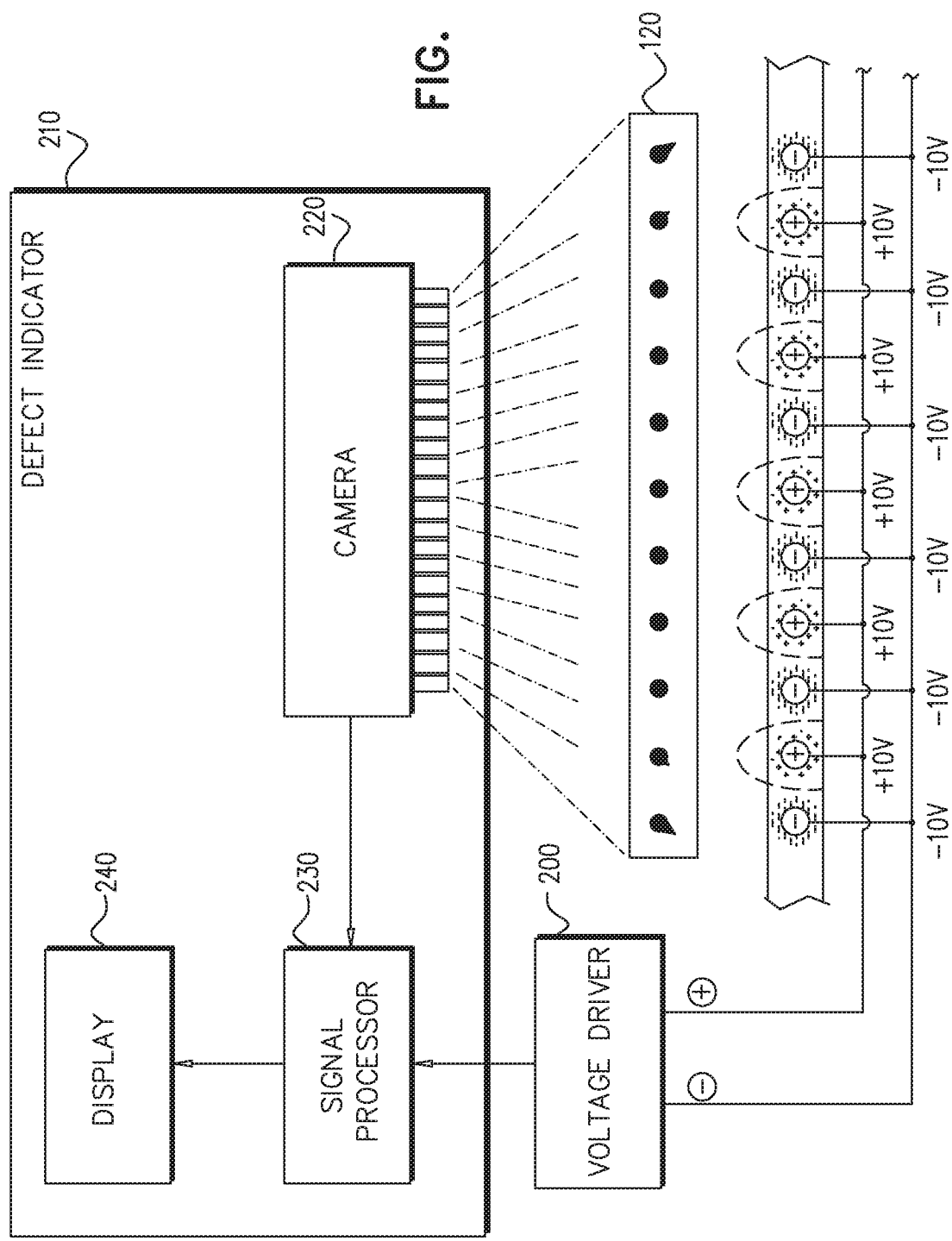
FIG. 2 is a simplified functional schematic illustration of the system of FIGS. 1A-1C.

Reference is now made to FIG. 2, which is a simplified functional schematic illustration of the system of FIGS. 1A-1C. As seen in FIG. 2, a voltage driver 200 applies voltages to individual conductors 110 of the electrical circuits in the flat panel display backplane electronic circuitry 102 currently being inspected. This is preferably achieved by use of shorting bars, examples of which are described in U.S. Pat. No. 5,081,687, the disclosure of which is hereby incorporated by reference. Alternatively, a two-dimensional array probing system may be used. An example of a suitable probing system is described in U.S. Patent Publication No. 2017/0146567, the disclosure of which is hereby incorporated by reference.

As noted above, in accordance with a preferred embodiment of the invention, adjacent conductors 110 are maintained at identical voltages of opposite polarity, such that in the absence of a defect, the electrical field overlying the conductors is zero or sufficiently near zero to enable effective defect detection. Alternatively, different voltage patterns may be employed, such as, for example, a ternary driving pattern in which three different conductors have three different voltages applied thereto, such that in the absence of a defect, the electrical field overlying the conductors is zero or sufficiently near zero to enable effective defect detection.

A defect indicator 210 is preferably provided to be responsive to outputs of the sensor 120 for ascertaining whether a defect exists in the plurality of conductors 110 underlying the sensor 120 at any given time. Preferably, the defect indicator 210 includes a camera 220, such as a 25 Megapixel modified OnSemi VITA25K model, commercially available from ON Semiconductor, 5005 East McDowell Road, Phoenix, Ariz. 85008, which views the sensor 120 and optically senses machine visually sensible changes therein which indicate non-zero electric fields, signal processing circuitry 230 and a display 240.

An output of camera 220 is preferably supplied to signal processing circuitry 230, which preferably filters the output of camera 220 to remove noise, such as shot noise and other unwanted artifacts. Signal processing circuitry 230 preferably coordinates the output of camera 220 with the operation of the voltage driver 200, so as to be able to associate the inspection output and any defect indications with an identifiable electrical circuit of flat panel display backplane electronic circuitry 102. Preferably, a defect indication, indicating the location and type of defect, is displayed to an operator, overlaid on an image of the electrical circuit being inspected, on display 240.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A system for inspection of electrical circuits, which electrical circuits include a multiplicity of conductors which are mutually spaced from each other, the system comprising:
a voltage driver operative to apply different electrical voltages to a plurality of conductors from among said multiplicity of conductors, wherein said plurality of conductors are in spatial propinquity to each other, wherein said plurality of conductors are mutually spaced and generally parallel, and wherein said voltage driver simultaneously applies said different electrical voltages to alternating ones of said generally parallel conductors;

a sensor operative to sense at least one characteristic of a test region defined thereby with respect to said electrical circuits, said sensor lacking sufficient spatial resolution to distinguish between locations of individual ones of said plurality of conductors, wherein said sensor is configured to measure an overall superimposition of electrical fields produced by the plurality of conductors, and wherein said sensor comprises an electro-optic modulator; and a defect indicator responsive to at least one output of said sensor for ascertaining whether a defect exists in said plurality of conductors.

2. A system for inspection of electrical circuits according to claim 1 and wherein said voltage driver applies said different electrical voltages which are selected such that the overall superimposition of electrical fields at said test region is zero in the absence of defects in said plurality of conductors.

3. A system for inspection of electrical circuits according to claim 2 and wherein said voltage driver applies said different electrical voltages which are selected such that the overall superimposition of the electrical fields at said test region is non-zero in the presence of defects in said plurality of conductors.

4. A system for inspection of electrical circuits according to claim 1 and wherein said defect indicator is operative to ascertain a location of a defect based on the overall superimposition of electrical fields at said test region detected by said sensor.

5. A system for inspection of electrical circuits according to claim 4 and wherein said defect indicator ascertains the location of a defect based on a value of the overall superimposition of the electrical fields at said test region.

6. A system for inspection of electrical circuits according to claim 1 and wherein said test region overlies said plurality of conductors.

7. A system for inspection of electrical circuits according to claim 1 and wherein said sensor is an electric field sensor.

8. A system for inspection of electrical circuits according to claim 1 and wherein said sensor is an electro-optical sensor.

9. A system for inspection of electrical circuits according to claim 1 and wherein said sensor is an optical sensor.

10. A system for inspection of electrical circuits according to claim 1 and wherein said defect indicator provides a human visually sensible indication of a defect and its location.

11. A system for inspection of electrical circuits, which electrical circuits include a multiplicity of conductors which are mutually spaced from each other, the system comprising:

a sensor operative to sense at least one characteristic of a test region defined thereby with respect to said electrical circuits, wherein said sensor is configured to measure an overall superimposition of electrical fields produced by a plurality of conductors, and wherein said sensor comprises an electro-optic modulator;

a voltage driver operative to apply different electrical voltages to said plurality of conductors from among said multiplicity of conductors, wherein said plurality of conductors are in spatial propinquity to each other, said voltage driver selecting said different electrical voltages such that the overall superimposition of electrical fields at said test region is zero in the absence of defects in said plurality of conductors, wherein said plurality of conductors are mutually spaced and generally parallel, and wherein said voltage driver simultaneously applies said different electrical voltages to alternating ones of said generally parallel conductors; and a defect indicator responsive to an output of said sensor for ascertaining whether a defect exists in said plurality of conductors.

12. A system for inspection of electrical circuits according to claim 11 and wherein said sensor lacks sufficient spatial resolution to distinguish between locations of said plurality of conductors.

13. A system for inspection of electrical circuits according to claim 11 and wherein said voltage driver applies said different electrical voltages which are selected such that the overall superimposition of the electrical fields at said test region is non-zero in the presence of defects in said plurality of conductors.

14. A system for inspection of electrical circuits according to claim 11 and wherein said defect indicator is operative to ascertain a defect location based on the overall superimposition of the electrical fields at said test region detected by said sensor.

15. A system for inspection of electrical circuits according to claim 14 and wherein said defect indicator ascertains said defect location based on a value of the overall superimposition of the electrical fields at said test region.

16. A system for inspection of electrical circuits according to claim 11 and wherein said test region overlies said plurality of conductors.

17. A system for inspection of electrical circuits according to claim 11 and wherein said sensor is an electric field sensor.

18. A system for inspection of electrical circuits according to claim 11 and wherein said sensor is an electro-optical sensor.

19. A system for inspection of electrical circuits according to claim 11 and wherein said sensor is an optical sensor.

20. A system for inspection of electrical circuits according to claim 11 and wherein said defect indicator provides a human visually sensible indication of a defect and its location.

21. A system for inspection of electrical circuits according to claim 11 and wherein said defect indicator comprises:
a camera which images said electro-optic modulator and provides a camera output;
image enhancement circuitry which receives said camera output and provides an image enhanced output; and
a display for displaying said image enhanced output.

22. A system for inspection of electrical circuits according to claim 11 and wherein the overall superimposed electric field in said test region at locations between each of said adjacent generally parallel conductors is approximately zero in the absence of a defect in said adjacent generally parallel conductors.

23. A system for inspection of electrical circuits according to claim 11 and wherein said sensor senses the overall superimposed electric field in said test region between each of said adjacent generally parallel conductors rather than at a location of a given conductor.

24. A system for inspection of electrical circuits according to claim 11 and wherein said sensor is separated from said electric circuits by a perpendicular distance which is a multiple of a distance separating adjacent ones of said mutually spaced parallel conductors.

25. A system for inspection of electrical circuits according to claim 24 and wherein said multiple is greater than two.

26. A method for inspection of electrical circuits, which electrical circuits include a multiplicity of conductors which are mutually spaced from each other, the method comprising:
 applying different electrical voltages to a plurality of conductors from among said multiplicity of conductors, wherein said plurality of conductors are in spatial propinquity to each other, wherein said plurality of conductors are mutually spaced and generally parallel, and wherein said different electrical voltages are simultaneously applied to alternating ones of said generally parallel conductors;
 sensing at least one characteristic of a test region defined thereby with respect to said electrical circuits, said sensing utilizing a sensor with an electro-optic modulator lacking sufficient spatial resolution to distinguish between locations of individual ones of said plurality of conductors, wherein said sensing is configured to measure an overall superimposition of electrical fields produced by the plurality of conductors; and
 ascertaining, responsive to said sensing, whether a defect exists in said plurality of conductors.

27. A method for inspection of electrical circuits according to claim 26, and also comprising selecting said different electrical voltages such that the overall superimposition of electrical fields at said test region is zero in the absence of defects in said plurality of conductors and non-zero in the presence of defects in said plurality of conductors.

28. A method for inspection of electrical circuits according to claim 26, wherein said sensing comprises sensing utilizing at least one of an electric field sensor, an electro-optic sensor or an optical sensor.

29. A method for inspection of electrical circuits according to claim 26, and also comprising, if a defect is detected in said plurality of conductors, ascertaining a location of said defect.

30. A method for inspection of electrical circuits according to claim 29, and also comprising:
 if a defect is detected, providing a human visually sensible indication of a defect and its location; and
 if no defect is detected, providing a human visually sensible indication that no defect has been detected.

31. A method for inspection of electrical circuits, which electrical circuits include a multiplicity of conductors which are mutually spaced from each other, the method comprising:
 applying different electrical voltages to a plurality of conductors from among said multiplicity of conductors, wherein said plurality of conductors are in spatial propinquity to each other;
 selecting said different electrical voltages such that an overall superimposition of electrical fields at said test region is zero in the absence of defects in said plurality of conductors and non-zero in the presence of defects in said plurality of conductors, wherein said plurality of conductors are mutually spaced and generally parallel, and wherein said different electrical voltages are simultaneously applied to alternating ones of said generally parallel conductors;
 sensing at least one characteristic of a test region defined thereby with respect to said electrical circuits, wherein said sensing is configured to measure the overall superimposition of electrical fields produced by the plurality of conductors, and wherein said sensing uses an electro-optic modulator; and
 ascertaining, responsive to said sensing, whether a defect exists in said plurality of conductors.

32. A method for inspection of electrical circuits according to claim 31, wherein said sensing comprises sensing utilizing at least one of an electric field sensor, an electro-optic sensor or an optical sensor.

33. A method for inspection of electrical circuits according to claim 31, and also comprising, if a defect is detected in said plurality of conductors, ascertaining a location of said defect.

34. A method for inspection of electrical circuits according to claim 33, and also comprising:
 if a defect is detected, providing a human visually sensible indication of a defect and its location; and
 if no defect is detected, providing a human visually sensible indication that no defect has been detected.

* * * * *